United States Patent
Wang et al.

(10) Patent No.: US 9,124,227 B2
(45) Date of Patent: Sep. 1, 2015

(54) DISTORTION LIMITER AND AUTOMATIC POWER CONTROL FOR DRIVERS

(71) Applicants: Minsheng Wang, Irvine, CA (US); Iuri Mehr, Irvine, CA (US); Jungwoo Song, Irvine, CA (US); Vinay Chandrasekhar, Irvine, CA (US)

(72) Inventors: Minsheng Wang, Irvine, CA (US); Iuri Mehr, Irvine, CA (US); Jungwoo Song, Irvine, CA (US); Vinay Chandrasekhar, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 397 days.

(21) Appl. No.: 13/622,170

(22) Filed: Sep. 18, 2012

(65) Prior Publication Data

US 2014/0079246 A1    Mar. 20, 2014

(51) Int. Cl.
| | |
|---|---|
| *H03F 99/00* | (2009.01) |
| *H03F 1/34* | (2006.01) |
| *H03F 1/32* | (2006.01) |
| *H03F 3/187* | (2006.01) |
| *H03F 3/45* | (2006.01) |
| *H03G 3/30* | (2006.01) |

(52) U.S. Cl.
CPC ............... *H03F 1/34* (2013.01); *H03F 1/3211* (2013.01); *H03F 3/187* (2013.01); *H03F 3/45475* (2013.01); *H03G 3/3005* (2013.01); *H03F 2203/45521* (2013.01)

(58) Field of Classification Search
None
See application file for complete search history.

(56) References Cited

U.S. PATENT DOCUMENTS

| 7,965,138 B2* | 6/2011 | Teplechuk ................. 330/10 |
| 2009/0027116 A1* | 1/2009 | Bach ........................ 330/2 |
| 2011/0123049 A1* | 5/2011 | Crespi et al. .............. 381/121 |

* cited by examiner

*Primary Examiner* — Regina N Holder
(74) *Attorney, Agent, or Firm* — Sterne, Kessler, Goldstein & Fox PLLC (57) ABSTRACT

Systems and methods are disclosed to provide automatic power control for a driver circuit. Embodiments disclosed herein enable a driver circuit to automatically decrease the gain of amplified input signals when output power exceeds a threshold. Further, embodiments disclosed herein enable a driver circuit to automatically increase the gain of amplified input signals when battery supply voltage drops to avoid unwanted output signal distortion. By using reference signals for battery power and amplified signal input, the amplifiers of the driver circuit can be automatically adjusted until an equilibrium is reached.

20 Claims, 10 Drawing Sheets

DISTORTION LIMITER AND AUTOMATIC POWER CONTROL FOR DRIVERS

FIELD OF THE INVENTION

This invention relates to signal processing and more specifically to power control.

BACKGROUND OF THE INVENTION

Changes in an amount of battery power supplied by a driver to an output device (e.g., a speaker) can cause unwanted effects on the output device. When the power supplied by a driver drops, the distortion at the device-output can increase. For example, total harmonic distortion (THD) measures the average amount of harmonic distortion present in a signal. THD can be defined by a ratio of the summed powers of the harmonic components of a signal to the fundamental frequency of the signal. When the battery supply drops, the THD of the output signal increases, and the output signal can become clipped, thereby increasing the power of the harmonic components relative to that of the fundamental frequency. Unwanted effects can also occur if the battery power becomes too high. For example, if the battery supply power exceeds a certain limit, it can cause damage to a speaker or load coupled to the driver.

BRIEF DESCRIPTION OF THE DRAWINGS/FIGURES

The accompanying drawings, which are incorporated in and constitute part of the specification, illustrate embodiments of the disclosure and, together with the general description given above and the detailed descriptions of embodiments given below, serve to explain the principles of the present disclosure. In the drawings.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

In the following description, numerous specific details are set forth to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

1. Overview

Figure 1A:
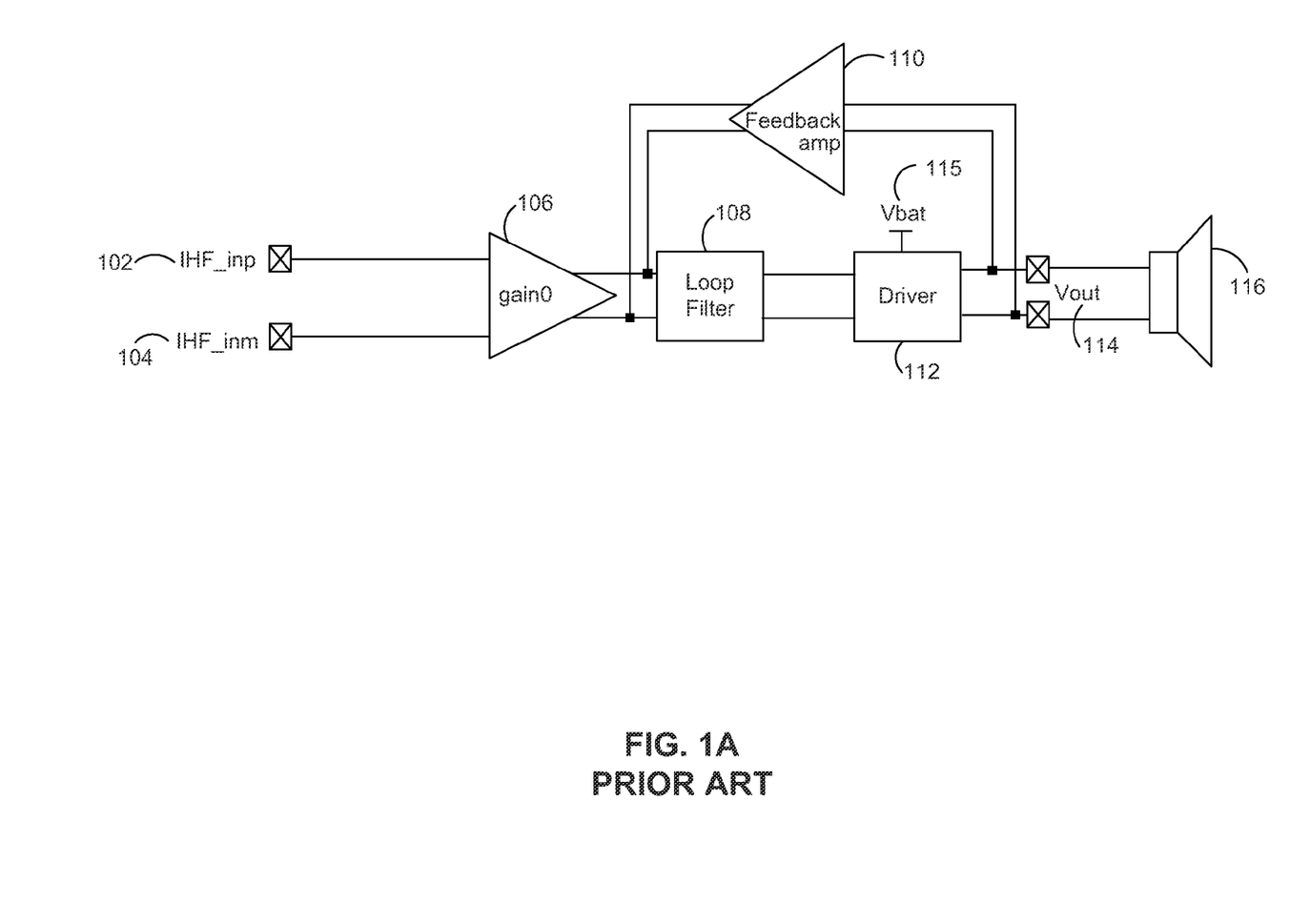
FIG. 1A is a diagram of a conventional driver circuit for an output device.

FIG. 1A is a diagram of a conventional driver circuit for an output device. In FIG. 1A, differential inputs 102 and 104 (e.g., audio inputs) are amplified by amplifier 106, filtered by loop filter 108, and are forwarded to driver 112. Driver 112 produces an output signal Vout 114 that is sent to output device 116 (e.g., a speaker). The driver of FIG. 1A also includes a feedback path formed by coupling the differential output 114 to an input of feedback amplifier 110. This feedback path improves linearity of the driver circuit and reduces distortion in the driver circuit. The output signal of feedback amplifier 110 combines with the output signal from amplifier 106 to form an error signal that is passed to the input of loop filter 108. This error signal is filtered by loop filter 108 and delivered to driver 112.

Figure 1B:
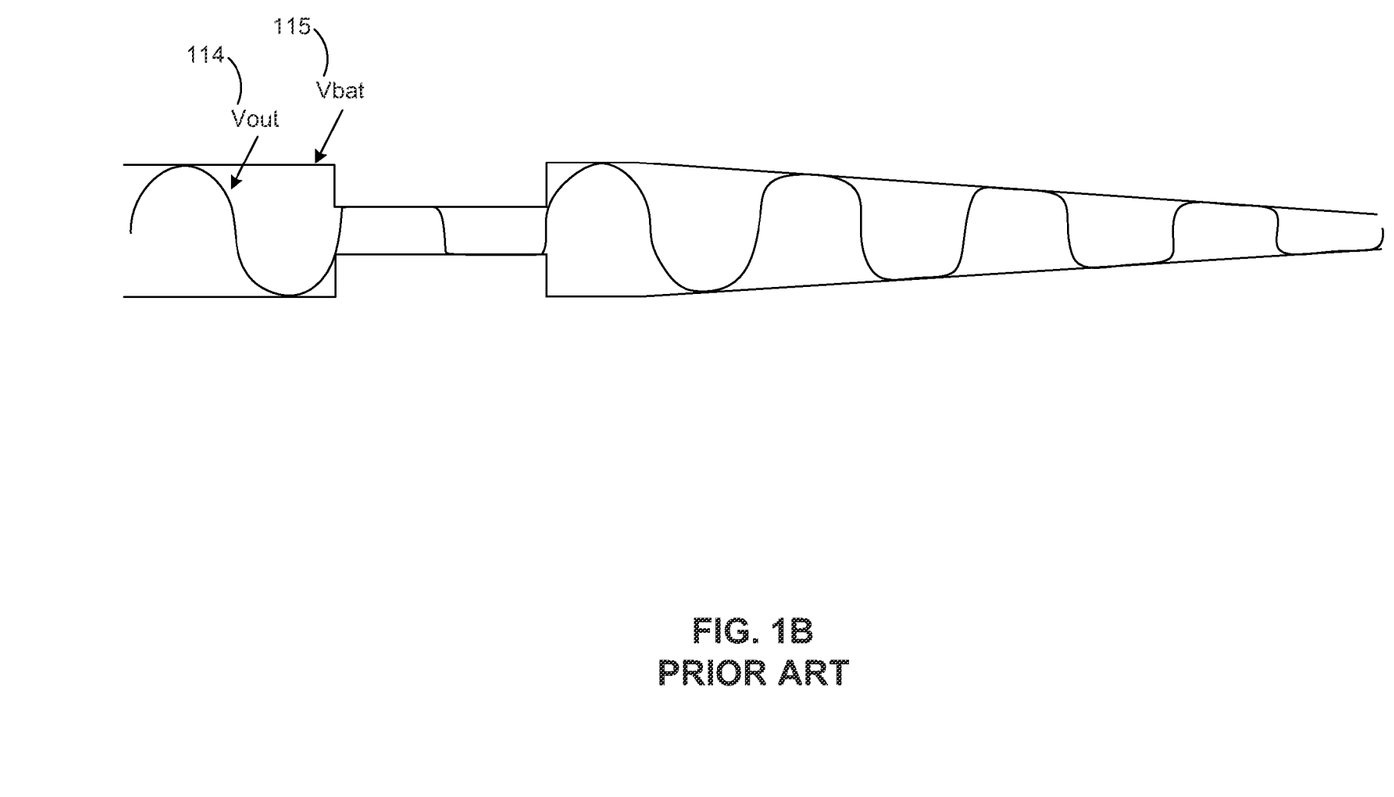
FIG. 1B is a diagram illustrating the clipping of a driver output signal that can occur as a result of a drop in battery power.

Driver 112 is powered by a battery and receives supply voltage Vbat 115. When the voltage output of Vbat 115 drops blow or exceeds corresponding lower or upper thresholds, Vout 114 can become distorted. FIG. 1B is a diagram illustrating the clipping of a driver output signal that can occur as a result of a drop in battery power. As shown by FIG. 1B, when Vbat 115 drops, Vout 114 is clipped, producing unwanted frequency harmonic components in the output of Vout 114. The THD of Vout 114 dramatically worsens when the output clips due to a drop in Vbat 115, and the harmonic generation. Additionally, if Vbat 115 exceeds a threshold and Vout 114 increases beyond a predefined power limit, output device 116 can be damaged.

Figure 1C:
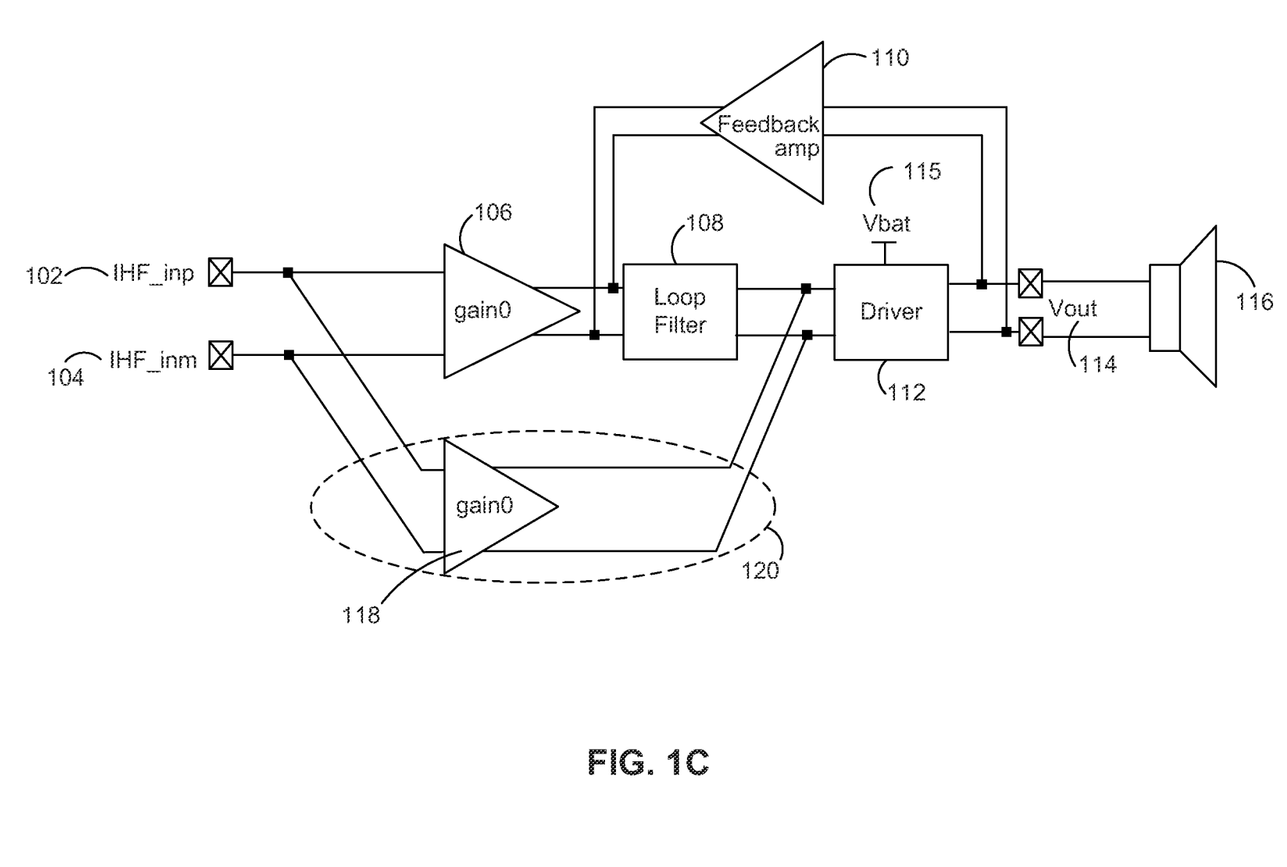
FIG. 1C is a diagram of a driver circuit incorporating a feed-forward loop to improve performance in accordance with an embodiment.

FIG. 1C is a diagram of a driver circuit incorporating a feed-forward loop to improve performance in accordance with an embodiment. In FIG. 1C, feed-forward path 120 is included to provide a direct path for differential inputs 102 and 104 to the input of driver 112 via amplifier 118. The inclusion of feed-forward path 120 into the driver circuit reduces the output swing of loop filter 108, which benefits overall THD performance. Additionally, by including feed-forward path 120 in the driver circuit of FIG. 1C, loop filter 108 can have more relaxed design specifications. For example, loop filter 108 can be designed to correct the noise from driver 112 generated from Vbat 115, which is passed to loop filter 108 via feedback amplifier 110. Due to feed-forward path 120, loop filter 108 does not need to process the entire input signal from differential inputs 102 and 104.

While the driver circuit of FIG. 1C reduces the output swing of loop filter 108 and allows for a relaxation of the design requirements of loop filter 108, additional improvement may be desired to alleviate the distortion of Vout 114 that occurs when Vbat drops or exceeds a threshold. Accordingly, systems and methods are provided to reduce the distortion of a signal output from a driver 112 caused by changes in battery supply power as discussed below.

2. Systems

Figure 2A:
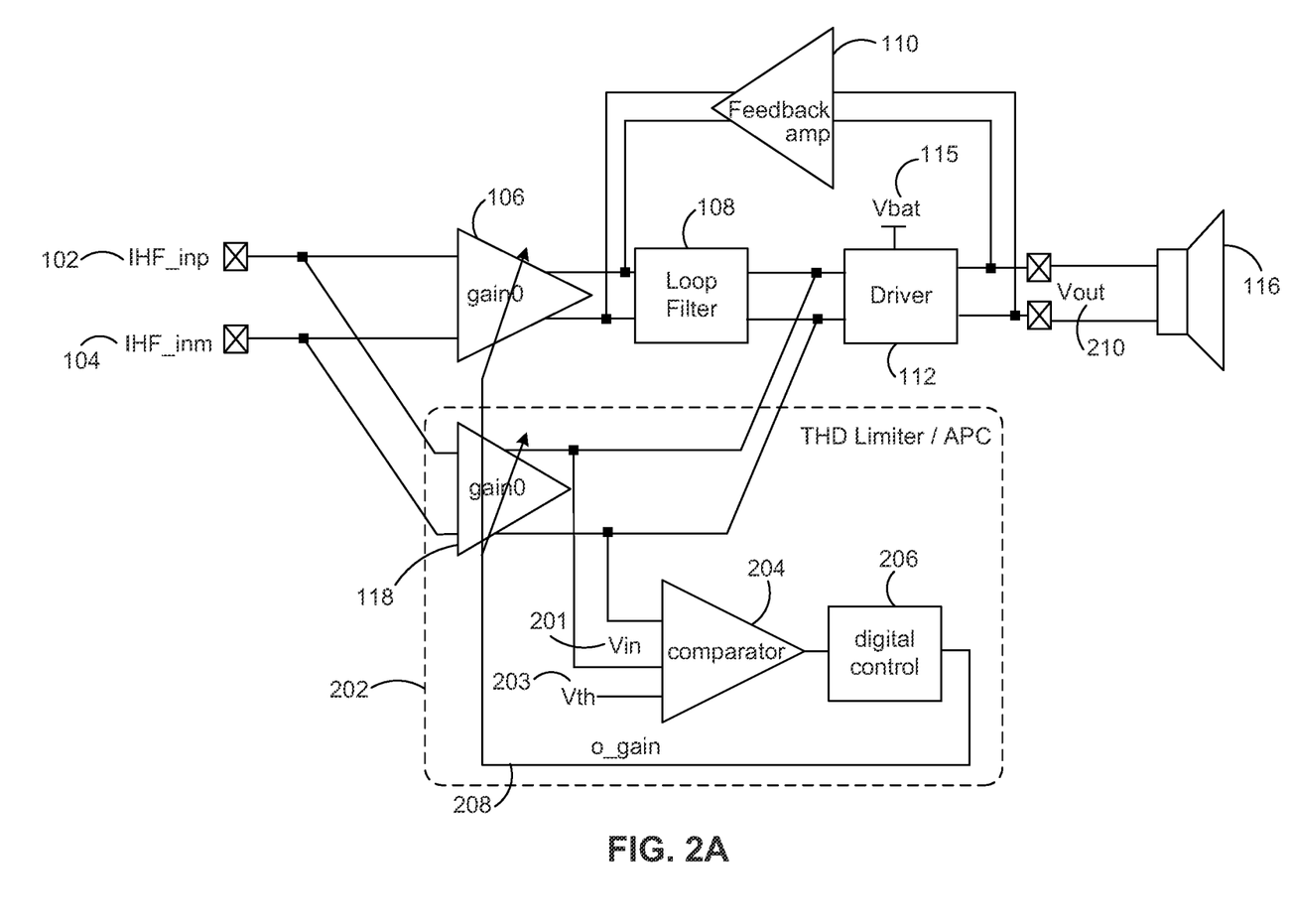
FIG. 2A is a diagram of a driver circuit that reduces distortion of a driver output signal resulting from an increase or decrease in battery supply power in accordance with an embodiment.

FIG. 2A is a diagram of a driver circuit that reduces distortion of a driver output signal resulting from an increase or decrease in battery supply power in accordance with an embodiment. FIG. 2A includes a new feed-forward path that produces a new Vout signal 210 with limited THD via automatic power control (APC) functionality.

In FIG. 2A, the output of amplifier 118 is used as an approximation of Vout 210. More specifically, the output of driver 112 is detected via feedback amplifier 110 and therefore represents Vout 210, instead of being detected directly because the output of driver 112 can include out of band signals. Further, the output of feedback amplifier 110 is approximately equal to the output of amplifier 106 given their outputs connect to a summing junction. Amplifier 118 mimics the gain of amplifier 106 because amplifiers 106 and 118 have a common input and are adjusted via a common digital control module 206. In one embodiment, amplifier 118 is a replica of amplifier 106. Thus, the output of amplifier 118 approximates Vout 210 because the output of amplifier 118 mimics the output of amplifier 110, which is an approximation of Vout 210 based on the discussion above. Before the APC is activated, amplifiers 106 and 118 have an original gain value (input gain value).

Feed-forward path 202 further includes a comparator 204 that drives digital control module 206. Comparator 204 includes a reference input Vth 203 that is a function of Vbat 115. For example, Vth 203 can be a programmable input, or Vth 203 can sense Vbat 115 directly (e.g., through a voltage divider). Comparator 204 compares Vth 203, which represents Vbat 115, with Vin 201, which represents Vout 210 and outputs the larger signal to digital control module 206. If Vin 201 (and thus Vout 210) is larger than Vth 203, digital control module 206 decreases the gain of amplifiers 106 and 118, using control signal o_gain 208, so to reduce distortion in output voltage 210. If Vin 201 (and thus Vout 210) is smaller than Vth 203, digital control module 206 increases the gain of amplifiers 106 and 118 via output signal o_gain 208 until the gain of amplifiers 106 and 118 reaches the original value (input gain value) or Vin 201 becomes larger than Vth 203. By continuing to adjust the gain of amplifiers 106 and 118 so that Vin 201 is kept close to the value of Vth 203, distortion in the driver circuit is reduced, and Vout 210 is prevented from increasing above a threshold that can damage output device 116. Thus, through this automatic power control functionality provided by feed-forward path 202, clipping of Vout 210 is eliminated, and output device 116 is protected with reduced output power.

Figure 2B:
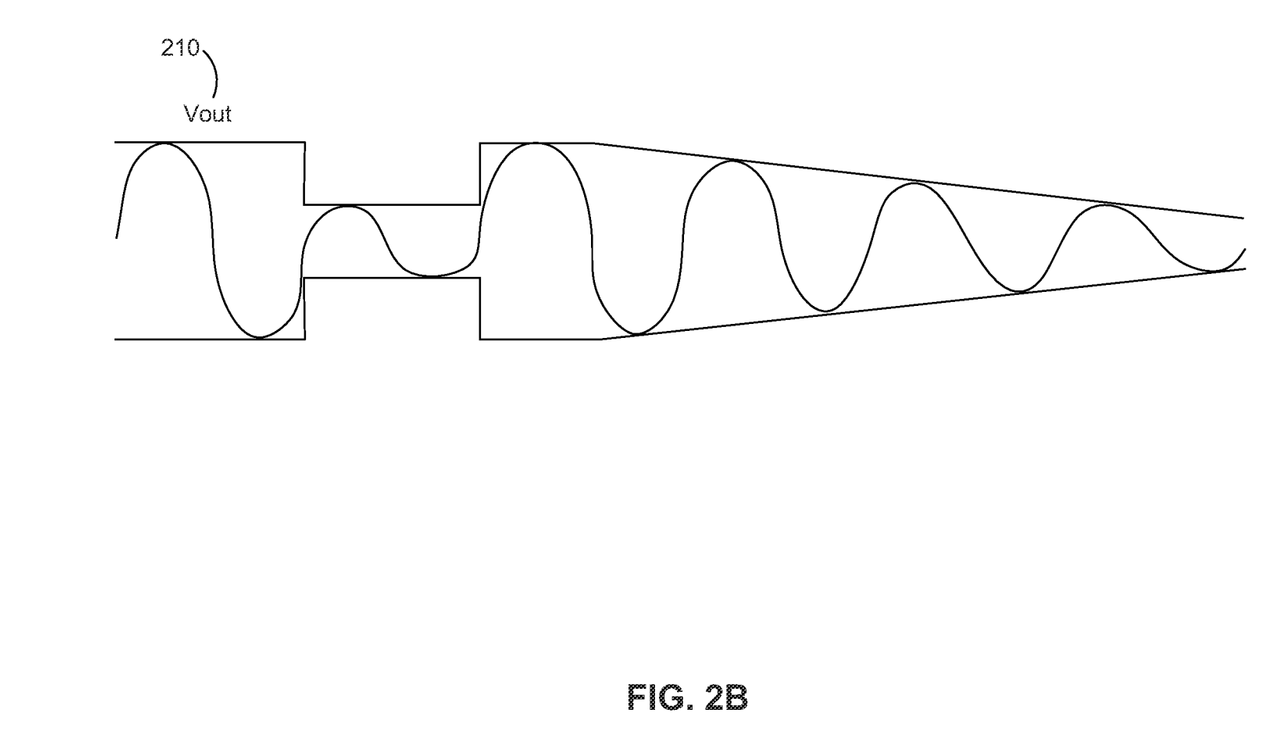
FIG. 2B shows a diagram illustrating the reduction in distortion of output power as a result of the feed-forward path of FIG. 2A.

FIG. 2B shows a diagram illustrating the reduction in distortion in Vout 210 as a result of feed-forward path 202 of FIG. 2A in accordance with an embodiment. As shown by FIG. 2B, the clipping of Vout 210 illustrated by FIG. 1B is greatly reduced by implementing automatic power control into the feed-forward circuit.

Figure 2C:
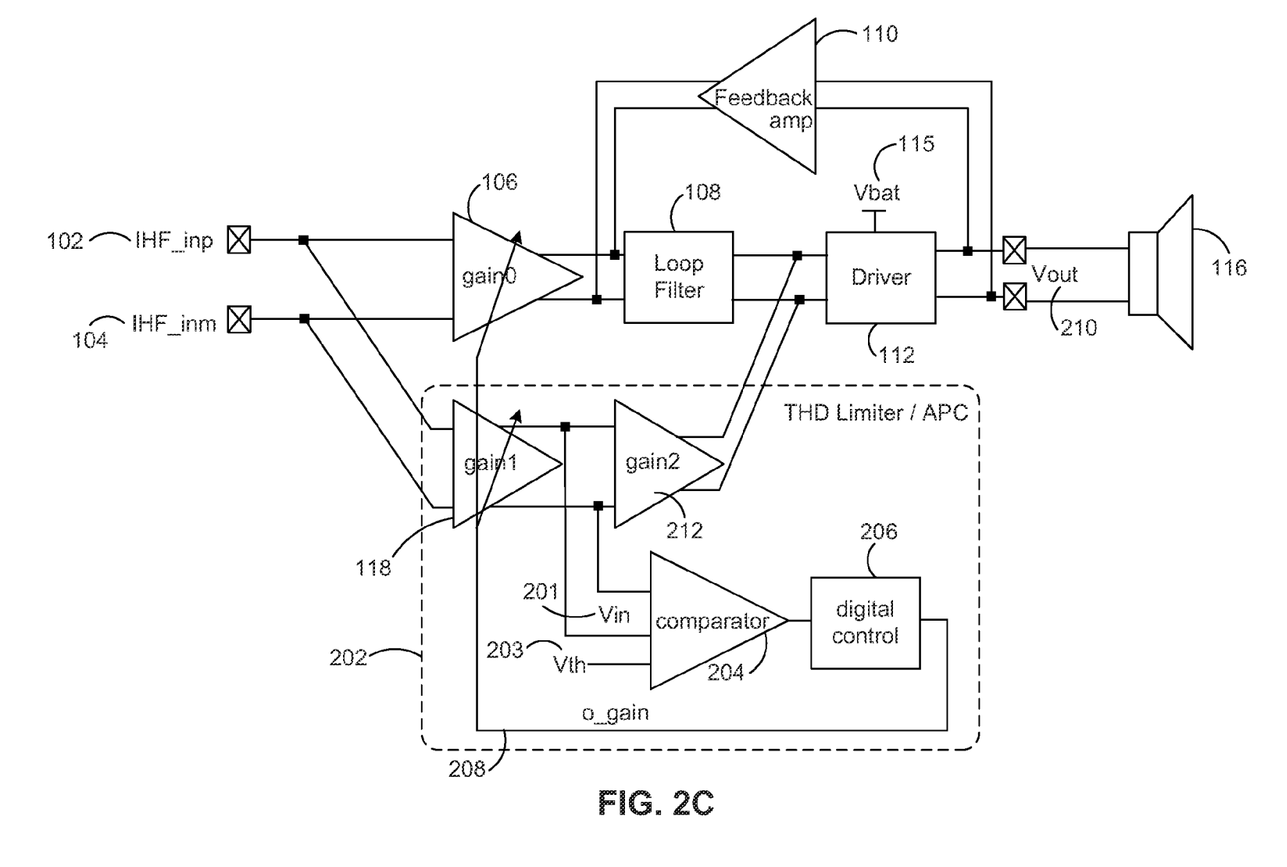
FIG. 2C is another diagram of a driver circuit that reduces distortion of a driver output signal resulting from an increase or decrease in battery supply power in accordance with an embodiment.

FIG. 2C is another diagram of a driver circuit that reduces distortion of a driver output signal resulting from an increase or decrease in battery supply power in accordance with an embodiment. In FIG. 2C, an additional amplifier 212 is included in feed-forward path 202, where the differential input of amplifier 212 is coupled to the output of amplifier 118, and the differential output of amplifier 212 is coupled to the input of driver 112. Amplifier 212 provides an amplified version of differential input signals 102 and 104 to driver 112. The feed-forward gain is split into a first gain, provided by amplifier 118 and a second gain, provided by amplifier 106. Amplifier 118 is used to set the input Vin 201 for comparator 204. Comparator 204 decreases the gain of amplifiers 118 and 106 when it detects that Vin 201 is larger than Vth 203 and increases the gain of amplifiers 118 and 106 when it detects that Vin 201 is smaller than Vth 203. This embodiment provides flexibility in designing comparator 204 such that it does not have to process high amplitude signals, even if Vout 210 has a large amplitude.

Figure 3A:
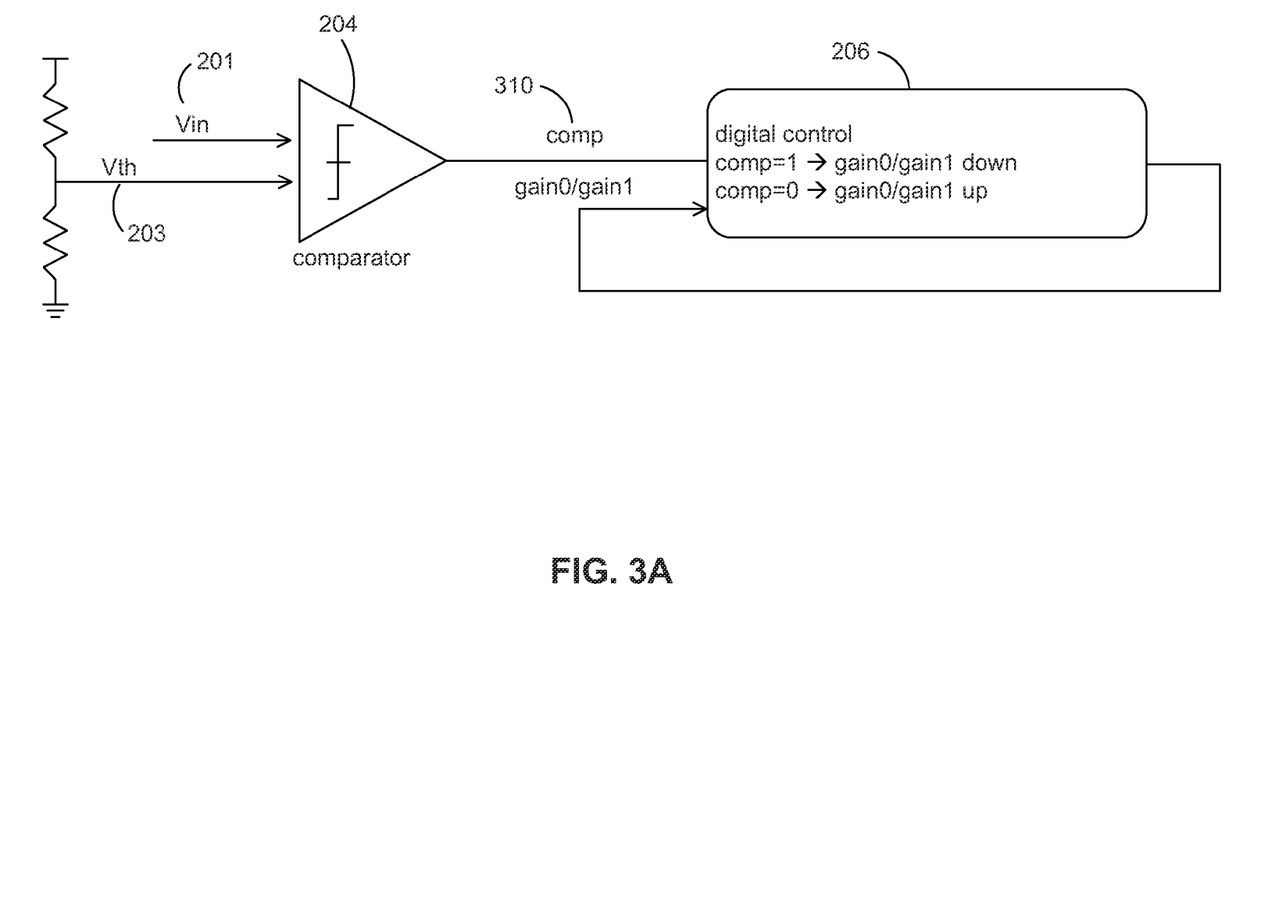
FIG. 3A is a diagram illustrating an operation of a digital control module in accordance with an embodiment.

FIG. 3A is a diagram illustrating an operation of digital control module 206 in accordance with an embodiment. Comparator 204 compares Vin 201 with Vth 203 and outputs a signal comp 310. Digital control module 206 receives comp signal 310 and decreases the gain of amplifiers 106 and 118 if comp 310 is equal to 1 and increases the gain of amplifiers 106 and 118 if comp 310 is equal to 0.

Figure 3B:
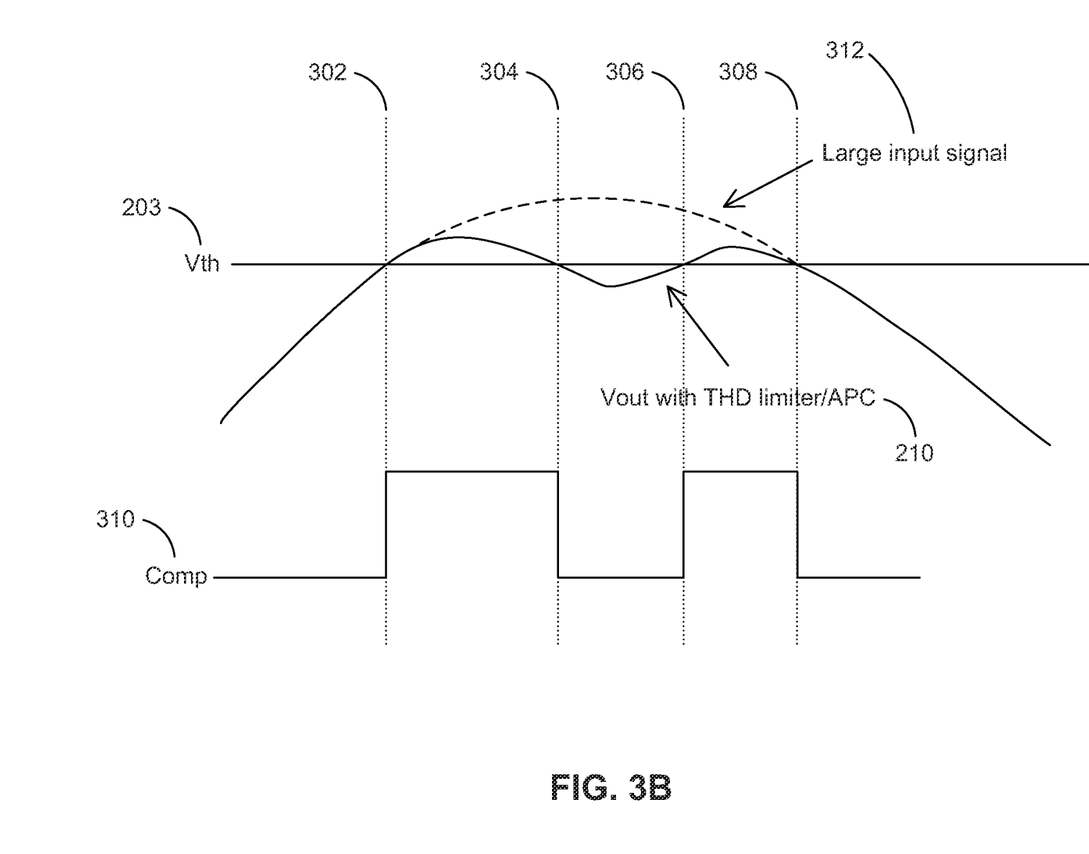
FIG. 3B is a diagram illustrating a timing diagram of a comparator in accordance with an embodiment.

FIG. 3B is a diagram illustrating a timing diagram of a comparator in accordance with an embodiment. When Vout 210 increases above Vth 203 at point 302 caused by large input signal 312, comp signal 310 switches to 1, initiating a decrease in gain of amplifiers 106 and 118. When Vout 210 starts to decrease below Vth at point 304, comp 310 switches to 0, initiating an increase in gain of amplifiers 106 and 118. The gain of amplifiers 106 and 118 is decreased again at point 306, when Vout 210 starts to increase above Vth 203. When Vout 210 begins to dip below Vth 203 again at point 308, comp signal 310 switches back to 0, and initiating an increase in gain of amplifiers 106 and 118. As illustrated by FIG. 3B, the APC functionality of feed-forward path 202 automatically adjusts Vout 210 so that it more closely tracks Vth 203, as long as the gain of amplifiers 106 and 118 is below or equal to the original gain value (input gain value). Thus, when a large input signal 312 is encountered, feed-forward path 202 automatically lowers Vout 210 to avoid damage to output device 116.

3. Methods

Figure 4:
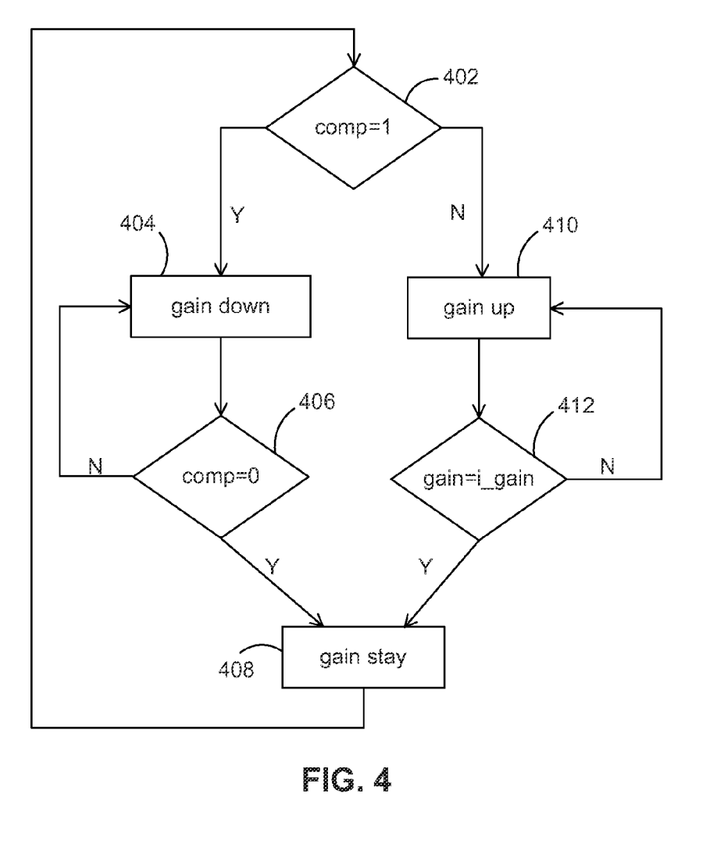
FIG. 4 is a flowchart illustrating a logic flow of a digital control module in accordance with an embodiment.

FIG. 4 is a flowchart illustrating a logic flow of digital control module 206 in accordance with an embodiment. As shown by FIG. 4, digital control module 206 can continually increase or decrease the gains of amplifiers 106 and 118 until they are equal to the input gain set by Vth 203 (e.g., when comp signal 310 is equal to 0). In step 402, the value of comp signal 310 is determined. If comp signal 310 is determined to be equal to 1, the gain of amplifiers 106 and 118 is decreased in step 404. The value of comp signal 310 is evaluated again in step 406. If comp signal 310 is equal to 0, then no gain adjustments are made to amplifiers 106 and 118 at step 408 because Vin 201 and Vth 203 have reached equilibrium. If comp signal 310 is not determined to be equal to 0 in step 406, the gain continues to ramp down until equilibrium between Vin 201 and Vth 203 is reached at step 408.

If comp signal 310 is not determined to be equal to 1 in step 402, the gain of amplifiers 106 and 118 is increased in step 410. If comp signal 310 equals zero in step 412 and the gain of amplifiers 106 and 118 (e.g., determined by Vin 201) is determined to equal to the original gain value (input gain value) then no gain adjustments are made to amplifiers 106 and 118 at step 408 because Vin 201 and Vth 203 have reached equilibrium or the gain is set back to the original gain value. If the gains of amplifiers 106 and 118 have not yet become equal to the input gain, then the gains of amplifiers 106 and 118 are continually ramped up in step 410 until equilibrium is reached.

Figure 5:
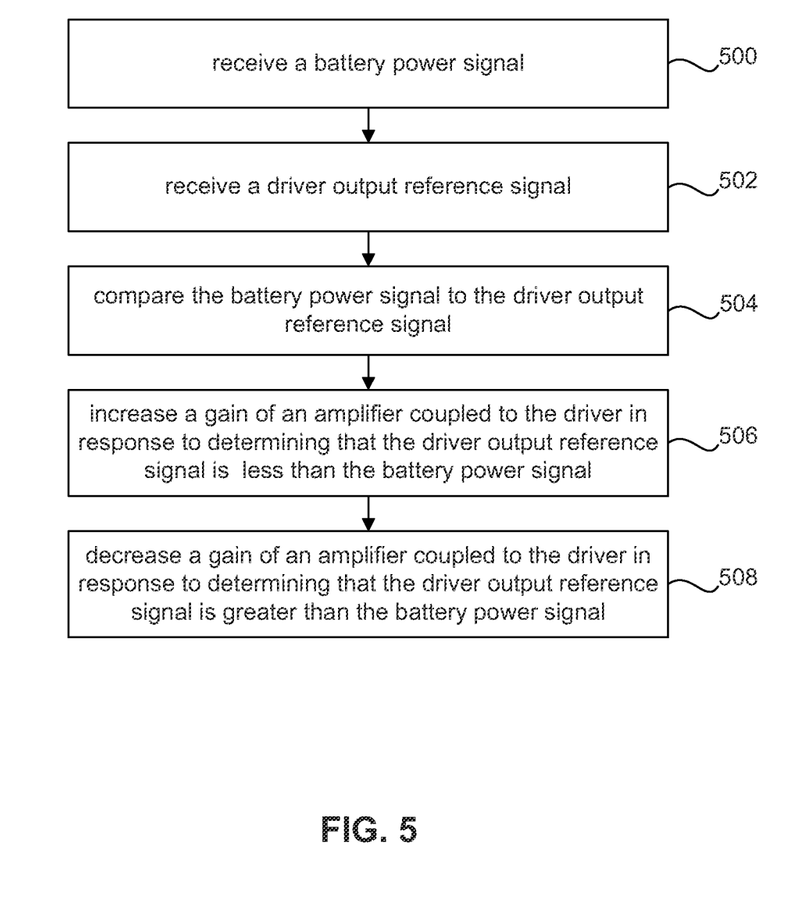
FIG. 5 is a flowchart of a method for power control in a driver circuit in accordance with an embodiment.

FIG. 5 is a flowchart of a method for power control in a driver circuit in accordance with an embodiment. In step 500, a battery power signal is received. For example, Vth 203 is input to comparator 204 as a reference signal of Vbat 115. In step 502, a driver output reference signal is received. For example, comparator 204 receives Vin 201 as a signal estimating driver Vout 210 because Vin 201 is the output of amplifier 118, which follows the output of amplifier 106, which receives a feedback signal of Vout 210 from feedback amplifier 110.

In step 504, the battery power signal is compared to the driver output reference signal. For example, comparator 204 compares Vin 201 with Vth 203 and outputs a 1 or 0 to digital control module 206 depending on which signal is larger. In step 506, a gain of an amplifier coupled to the driver is increased in response to determining that the driver output reference signal is less than the battery power signal. For example, if Vin 201 is less than Vth 203, the gain of amplifier 118 (and/or amplifier 106) is increased. In an embodiment, the gain of amplifier 118 (and/or amplifier 106) is continually increased until Vin 201 and Vth 203 are equal and equilibrium has been reached or the gain becomes equal to the original gain (input gain)

In step 508, a gain of an amplifier coupled to the driver is decreased in response to determining that the driver output reference signal is greater than the battery power signal. For example, if Vin 201 is larger than Vth 203, driver 112 is producing a large Vout 210 signal that can potentially damage output device 116. Thus, the gain of amplifier 118 (and/or amplifier 106) is reduced to avoid damaging output device 116. In an embodiment, the gain of amplifier 118 (and/or amplifier 106) is continually reduced until Vin 201 and Vth 203 are equal and equilibrium has been reached.

4. Advantages

Systems and methods disclosed herein automatically reduce distortion produced by a driver output signal when the battery supply power decreases. Further, systems and methods disclosed herein automatically decrease output power when output power exceeds a predetermined threshold. Additionally, systems and methods disclosed herein can reduce distortion even if battery power remains constant. For example, even if the battery supply (e.g., Vbat 115) remains constant, but for some reason the distortion in a driver output signal (e.g., Vout 210) needs to be limited (e.g., if a user plugs in a new load with less tolerance or a load with higher quality and distortion is more audible), feed-forward loop 202 can be configured to reduce distortion accordingly. For example, Vth 204 can be set to a new value so that comparator 204 adjusts the gains of amplifiers 106 and 118 in a more sensitive manner.

5. Conclusion

It is to be appreciated that the Detailed Description, and not the Abstract, is intended to be used to interpret the claims. The Abstract may set forth one or more but not all exemplary embodiments of the present disclosure as contemplated by the inventor(s), and thus, is not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The representative signal processing functions described herein can be implemented in hardware, software, or some combination thereof. For instance, the signal processing functions can be implemented using computer processors, computer logic, application specific circuits (ASIC), digital signal processors, etc., as will be understood by those skilled in the art based on the discussion given herein. Accordingly, any processor that performs the signal processing functions described herein is within the scope and spirit of the present invention.

The above systems and methods may be implemented as a computer program executing on a machine, as a computer program product, or as a tangible and/or non-transitory computer-readable medium having stored instructions. For example, the functions described herein could be embodied by computer program instructions that are executed by a computer processor or any one of the hardware devices listed above. The computer program instructions cause the processor to perform the signal processing functions described herein. The computer program instructions (e.g. software) can be stored in a tangible non-transitory computer usable medium, computer program medium, or any storage medium that can be accessed by a computer or processor. Such media include a memory device such as a RAM or ROM, or other type of computer storage medium such as a computer disk or CD ROM. Accordingly, any tangible non-transitory computer storage medium having computer program code that cause a processor to perform the signal processing functions described herein are within the scope and spirit of the present disclosure.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A driver circuit comprising:
a first amplifier configured to receive an input signal;

a driver coupled to an output of the first amplifier, wherein the driver is configured to receive a supply voltage and generate an output signal;
a comparator coupled to an output of the first amplifier, wherein the comparator is configured to:
receive a reference of the supply voltage and a reference of the output signal,
compare the reference of the supply voltage with the reference of the output signal, and generate a comparator output signal indicating whether the supply voltage is larger than the output signal; and
a digital control module coupled to an output of the comparator, wherein the digital control module is configured to determine, based on the comparator output signal, whether to increase or decrease a first gain of the first amplifier.

2. The driver circuit of claim 1, further comprising:
a feedback amplifier coupled between an output of the driver and an input of the driver.

3. The driver circuit of claim 2, further comprising:
a filter coupled to an input of the driver and an output of the feedback amplifier.

4. The driver circuit of claim 1, further comprising:
a second amplifier configured to receive the input signal, wherein the digital control module is further configured to adjust a second gain of the second amplifier, wherein the first gain and the second gain are equal.

5. The driver circuit of claim 1, further comprising:
a third amplifier coupled to an output of the first amplifier and an input of the driver.

6. The driver circuit of claim 1, wherein the reference of the supply voltage is a representation of the supply voltage, and wherein the reference of the output signal is a representation of the output signal.

7. A driver circuit comprising:
a first amplifier configured to receive an input signal;
a driver coupled to an output of the first amplifier, wherein the driver is configured to:
receive a supply voltage, and
generate an output signal; and
a feed-forward loop coupled to an input of the driver, wherein the feed-forward loop is configured to receive the input signal, and wherein the feed-forward loop is configured to:
detect the output signal, and
automatically adjust a gain of the first amplifier.

8. The driver circuit of claim 7, further comprising a feedback amplifier coupled to an output of the driver, wherein the feedback amplifier is configured to generate a feedback signal.

9. The driver circuit of claim 8, wherein the feed-forward loop is configured to detect the output signal by detecting the feedback signal.

10. The driver circuit of claim 7, wherein the feed-forward loop is configured to automatically adjust the gain of the first amplifier by automatically decreasing the gain of the first amplifier in response to determining that the output signal is subject to distortion.

11. The driver circuit of claim 7, wherein the feed-forward loop is configured to automatically adjust the gain of the first amplifier by automatically decreasing the gain of the first amplifier in response to detecting a drop in the supply voltage.

12. The driver circuit of claim 7, wherein the feed-forward loop is configured to automatically adjust the gain of the first amplifier by automatically decreasing the gain of the first amplifier in response to determining that the output signal exceeds a predetermined threshold.

13. The driver circuit of claim 7, wherein the feed-forward loop comprises:
a comparator coupled to an output of the first amplifier, wherein the comparator is configured to receive a reference of the supply voltage; and
a digital control module coupled to an output of the comparator, wherein the digital control module is configured to automatically adjust the gain of the first amplifier.

14. A method comprising:
receiving, using a comparator, a battery power signal, wherein the battery power signal represents power supplied to a driver;
receiving, using the comparator, a driver output reference signal;
comparing, using the comparator, the battery power signal to the driver output reference signal; and
in response to determining that the driver output reference signal is less than the battery power signal, increasing a gain of an amplifier coupled to an input of the driver.

15. The method of claim 14, further comprising:
adjusting the gain of the amplifier coupled to the driver until the driver output reference signal is equal to the battery power signal.

16. The method of claim 14, further comprising:
adjusting the gain of the amplifier coupled to the driver until a signal produced by the driver is no longer clipped.

17. The method of claim 14, further comprising:
in response to determining that the driver output reference signal is greater than the battery power signal, decreasing the gain of the amplifier coupled to the driver.

18. The method of claim 14, further comprising:
adjusting the gain of the amplifier coupled to the driver until a signal produced by the driver does not exceed a predetermined threshold.

19. A driver circuit comprising:
a driver, wherein the driver is configured to:
receive a supply voltage, and
generate an output signal;
a feedback amplifier coupled to an output of the driver, wherein the feedback amplifier is configured to generate a feedback signal;
a first amplifier coupled to an output of the feedback amplifier, wherein the first amplifier is configured to receive an input signal; and
a total harmonic distortion (THD) limiter comprising:
a second amplifier coupled to an input of the driver, wherein the second amplifier and the first amplifier share a gain control, and wherein the second amplifier is configured to receive the input signal,
a comparator coupled to an output of the second amplifier, wherein the comparator is configured to receive a reference of the supply voltage, and
a digital control module coupled to an output of the comparator, wherein the digital control module is configured to adjust, via the gain control, a first gain of the first amplifier and a second gain of the second amplifier.

20. The driver circuit of claim 19, wherein the second amplifier is configured to generate, based on the gain control shared with the first amplifier, a reference of the feedback signal, and wherein the comparator is configured to receive the reference of the feedback signal.

* * * * *